United States Patent [19]
Chin et al.

[11] Patent Number: 5,389,575
[45] Date of Patent: Feb. 14, 1995

[54] SELF-ALIGNED CONTACT DIFFUSION BARRIER METHOD

[75] Inventors: Maw-Rong Chin; Gary Warren, both of Huntington Beach; Kuan-Yang Liao, Laguna Niguel, all of Calif.

[73] Assignee: Hughes Aircraft Company, Los Angeles, Calif.

[21] Appl. No.: 39,718

[22] Filed: Mar. 29, 1993

Related U.S. Application Data

[63] Continuation-in-part of Ser. No. 729,243, Jul. 12, 1991, abandoned.

[51] Int. Cl.6 .......................................... H01L 21/441
[52] U.S. Cl. .................... 437/190; 437/195; 437/200; 437/235
[58] Field of Search ............... 437/195, 190, 200, 235

[56] References Cited

U.S. PATENT DOCUMENTS

| | | |
|---|---|---|
| 4,690,730 | 9/1987 | Tang et al. |
| 4,772,571 | 9/1988 | Scovell et al. ................ 437/200 |
| 4,804,636 | 2/1989 | Groover, III et al. ......... 437/200 X |
| 4,920,071 | 4/1990 | Thomas ........................ 437/200 X |
| 5,103,272 | 4/1992 | Nishiyama .................... 357/23.1 X |

OTHER PUBLICATIONS

Kozicki et al "Silicide Formation on Polycrystalline Silicon . . . ", *J. Elect. Soc.*, vol. 136, No. 3, Mar. 1989, pp. 878–881.

Ghandi, S. K., et al, "VLSI Fabrication Principles", John Wiley & Sons, 1983 USA p. 499.

*Primary Examiner*—John S. Maples
*Attorney, Agent, or Firm*—Elizabeth E. Leitereg; Terje Gudmestad; W. K. Denson-Low

[57] ABSTRACT

A method of forming a contact diffusion barrier in a thin geometry integrated circuit device involves implanting a second material into a low resistivity material that overlies the semiconductor to which contact is desired. The low resistivity and implanted materials are selected to intereact with each other and form a contact diffusion barrier. Both materials may include transition metals, in which case the diffusion barrier is a composite transition metal. Alternately, the low resistivity material may include a transition metal, while implantation is performed with nitrogen. The implantation is performed by plasma etching, preferably with active cooling, which can be combined in a continuous step with the etching of the contact opening. The resulting contact diffusion barrier is self-aligned with the contact opening, and is established only in the immediate vicinity of the opening.

5 Claims, 4 Drawing Sheets

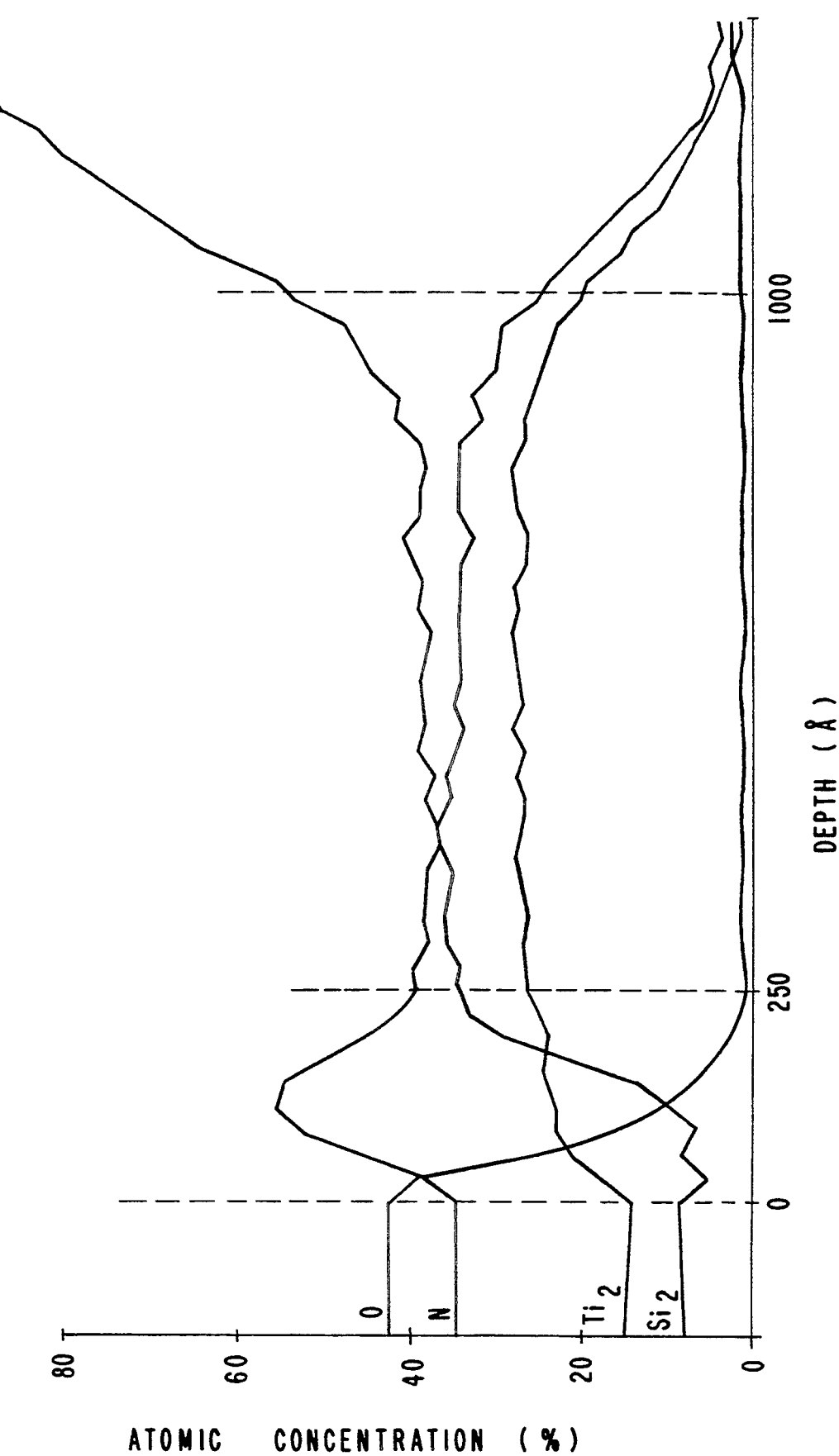

SELF-ALIGNED CONTACT DIFFUSION BARRIER METHOD

RELATED APPLICATION

This is a continuation-in-part of U.S. application Ser. No. 07/729,243, filed Jul. 12, 1991, now abandoned by the same inventors.

BACKGROUND OF THE INVENTION

1. Field of the Invention

This invention relates to the formation of conductive contacts in the fabrication of integrated circuits, and more particularly to a method and apparatus for preventing diffusion of the contact material into the underlying semiconductor.

2. Description of the Related Art

When contact metallization is placed in direct contact with an underlying semiconductor substrate during microelectronic fabrication, problems can develop from an interdiffusion of the contact metal into the semiconductor. This problem is illustrated in FIG. 1, in which a metallization layer 2 establishes a contact with a semiconductor wafer 4 through an opening in an insulating layer 6. In the illustration of FIG. 1, the metallization contact is made to a source or drain region 8 of a field effect transistor (FET), with the source/drain region 8 doped N+ and set in a P— well 10. The metallization, semiconductor and insulator will typically be aluminum, silicon and $SiO_2$, although the described situation occurs with other materials also. The contact metal tends to interdiffuse into the semiconductor material at temperatures above about 400° C., a temperature level that is commonly encountered during device packaging. This results in a spiking 11 of the metal into the semiconductor. The spiking generally extends for less than about 0.5 microns into the semiconductor, and thus is not a particular problem when the source/drain region 8 is greater than 0.5 microns deep. However, for thin geometries in which the source/drain region is less than 0.5 microns thick, the spiking can short the metallization layer to the P— well, thus rendering the device inoperative.

The conventional resolution of the contact metal intern diffusion problem is illustrated in FIG. 2. The semiconductor substrate 4 is capped with a layer of low resistance material, typically a silicide such as $TiSi_2$. This reduces the sheet resistance of the source/drain region 8, which increases significantly with thin geometries. A contact diffusion barrier layer 14 is then applied over the silicide layer 12, and capped by an insulative oxide layer 16. Both of the layers 12 and 14 are established by a sputtering process. Electrical contact to the underlying source/drain region 8 is made by forming an opening through the insulating layer 16, and forming a contact through the opening to the diffusion barrier layer 14. This in turn establishes an electrical contact to the source/drain region 8 through the conductive layers 12 and 14, while the diffusion barrier layer 14 prevents interdiffusion of the contact metal into the underlying semiconductor during subsequent heating. TiN is usually sputtered on as the diffusion barrier material. In addition to inhibiting contact metal spiking, it also helps to reduce the resistivity at the surface of the source/drain region.

A problem has been encountered with this process, stemming from the fact that the sputtered layers 12 and 14 are quite thin, typically about 300–1,000 Angstroms thick. This problem is illustrated in FIG. 3. When a contact opening 18 is etched into the oxide layer 16, it is generally over-etched somewhat to ensure that a complete opening is made. It is difficult to prevent the portion of diffusion barrier layer 14 underlying the contact layer from also being etched away, either partially or completely. Thus, the diffusion barrier may be present everywhere except under the contact opening, but that is precisely where it is needed.

A modification of this approach is shown in FIG. 4, and is also described in U.S. Pat. No. 4,690,730 to Tang, et al. In this approach, the oxide layer 16 is laid down directly over the silicide layer 12. A contact diffusion barrier 20 such as TiN is sputtered over the oxide layer after the contact opening 18 has been made. Since sputtering of the contact diffusion barrier is done after the contact opening has been established, the problem of etching away the contact diffusion barrier from the area of the opening is eliminated. However, after the metallization has been laid down and patterned over the barrier layer, a separate patterning and etch procedure must be performed to remove the diffusion barrier material from the areas where the metallization has been removed. Together with the extra step required to lay down the barrier layer, the separate etch required for that layer adds an additional processing step that slows down throughput, and consequently increases the manufacturing cost. In addition, much of the barrier material is simply wasted when it is etched away, further increasing the costs of production.

SUMMARY OF THE INVENTION

This invention provides an improved method of preparing a semiconductor with a contact diffusion barrier that uses fewer processing steps than the prior method, is less wasteful of diffusion barrier material, and results in a barrier layer than is inherently self-aligned with the contact opening. The invention also encompasses the unique contact structure that results from this process.

A layer of low resistivity materials is formed over the semiconductor, as before, with an insulating layer over the low resistivity material. A contact opening is formed in the insulating layer, and a second material is implanted into the low resistivity material through the contact opening. The low resistivity and implanted materials are selected to form a conductive diffusion barrier within the contact opening that resists diffusion from an overlying metal contact into the semiconductor.

In one embodiment, the low resistivity and implanted materials both include transition metals, so that the diffusion barrier is a composite transition metal. In another embodiment, the low resistivity material includes a transition metal and the implanted material is nitrogen, with the diffusion barrier comprising the nitride of the transition metal.

The implantation is preferably accomplished by plasma etching. The plasma etching can be combined with the etching step used to open the contact opening in the insulating material, thus saving a fabrication step. This is accomplished by simply switching from an etchant for the insulating material to the material to be implanted. When the low resistivity material is $TiSi_2$, plasma etching with nitrogen at a dc bias of at least 500 volts will produce a satisfactory TiN diffusion barrier. The plasma etching is performed unheated, and preferably with an active cooling of the wafer.

These and other features and advantages of the invention will be apparent to those skilled in the art from the following detailed description, taken together with the accompanying drawings, in which:

DESCRIPTION OF THE DRAWINGS

FIG. 5 is a plot showing the relative proportions of materials as a function of depth for one example of the invention;

DETAILED DESCRIPTION OF THE INVENTION

Figure 1:
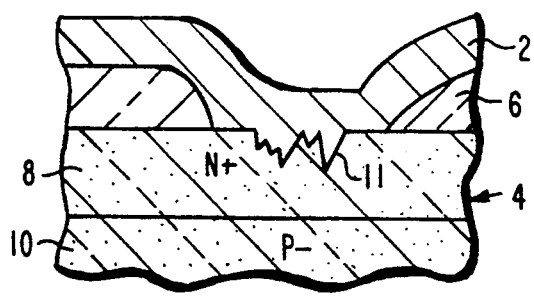
FIGS. 1-4 illustrate the contact diffusion problem and prior approaches to resolving it.
Figure 2:
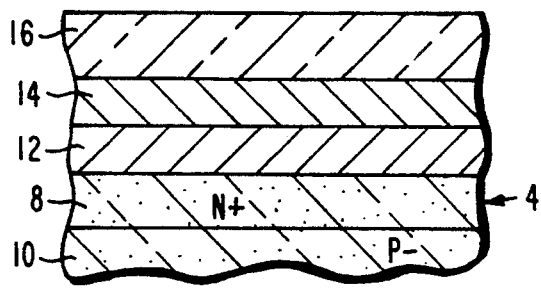
Figure 3:
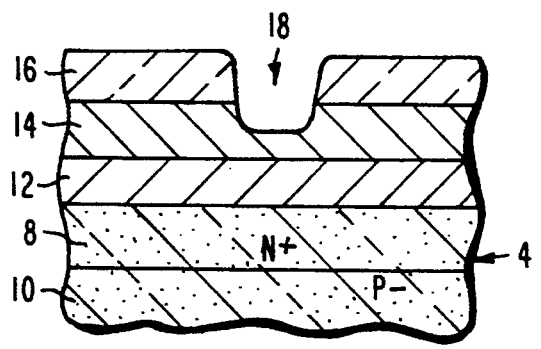
Figure 4:
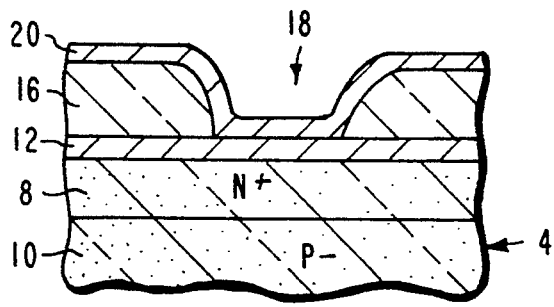

In the present invention, a contact diffusion barrier is formed not by sputtering on a layer of finished barrier material, but by implanting a component of the barrier material into the resistivity material to establish a third material that comprises the barrier. By performing the implantation through a contact opening that has been previously established in the oxide layer, the barrier can be self-aligned with the opening and thus restricted only to the area where it is actually needed.

A wide variety of materials can be used to implement the invention. In one approach, both the low resistivity material and the implanted material include a transition metal, with the transition metals from the two source materials forming a composite transition metal diffusion barrier. Silicides of the transition metals, such as $TiSi_2$, $TaSi_2$, $CoSi_2$, $WSi_2$, $PdSi_2$, $MoSi_2$ or $RuSi_2$, are preferred because they establish a good contact to the underlying semiconductor material. However, assuming a satisfactory contact can be made, pure transition metals might also be used for the low resistivity layer.

The implanted material in this first approach preferably consists of an elemental transition metal, with tungsten a preferred material. When implanted into the low resistivity layer under the proper conditions, preferably by plasma etching, a composite transition metal which combines the implant material and the transition metal from the low resistivity layer is formed; such composite transition metals are effective diffusion barriers. When tungsten is used for the implant, a composite transition metal layer with tungsten substituted for $Si_2$ is formed over the remainder of the low resistivity layer. While composite metals formed from two different transition metals are easier to work with, three or more different transition metals could also be used to form the composite.

In the other approach, the low resistivity layer again includes a transition metal, but a non-transition metal is implanted into it. Nitrogen has been found to be a suitable implant for this purpose. For example, when nitrogen is implanted into $TiSi_2$ under the proper conditions, a nitridation process occurs in which Ti moves upward several hundred Angstroms into the implant area to interact with the nitrogen therein and form TiN. The composition of the underlying $TiSi_2$ layer accordingly changes to a composition with a higher proportion of Si. It may also be feasible to implant oxygen into interstitial locations in a transition metal to form a metal diffusion barrier such as InSnO.

A plasma enhanced nitridation has been found to occur when $N_2$ plasma is etched into a layer of $TiSi_2$, resulting in a diffusion barrier layer of TiN in the upper portion of the formerly $TiSi_2$ layer, when the plasma etch is performed at an induced DC bias of at least 500 volts. Successful formation of a TiN diffusion barrier layer has not been achieved with bias voltages less than 500 volts. In general, the induced DC bias can be increased by increasing the power or reducing pressure.

In one example, a plasma nitrogen etch was performed on a $TiSi_2$ substrate at a power of 1 kw, 50 mTorr pressure, with an induced dc bias on the substrate of 550 volts. The $N_2$ flow rate was 50 Standard cc/min (Sccm) for 30 minutes. The resulting percentage of atomic concentration of the various components as a function of depth in the original $TiSi_2$ layer is shown in FIG. 5. (FIG. 5 was actually plotted as a function of etch time, but this is convertible to depth.) It can be seen that Ti and N are present in roughly equal proportions down to a depth of about 250 Angstroms (the percentage of titanium is plotted as $Ti_2$, not Ti, in FIG. 5, so the proportion of Ti relative to the amount of N is actually double the amount indicated for $Ti_2$ in FIG. 5.) This indicates the successful formation of a TiN diffusion barrier in this region. Between 250 and roughly 1,000 Angstroms, the proportion of nitrogen gradually decreases while titanium remains relatively fixed, indicating a reduction in the amount of TiN in this region. Beyond a threshold a little bit less than 1,000 Angstroms, the proportions of titanium and nitrogen fall off, while the proportion of $Si_2$ increases rapidly; this evidences the upper lattice expansion of the titanium to form the TiN.

Figure 6:
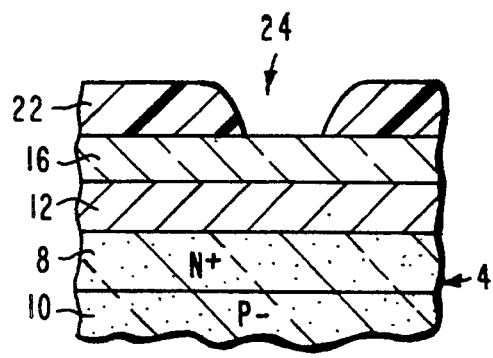
FIGS. 6-8 are fragmentary sectional views illustrating the formation of a contact diffusion barrier in accordance with the present invention.
Figure 7:
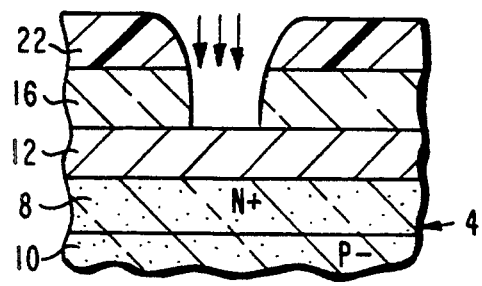
Figure 8:
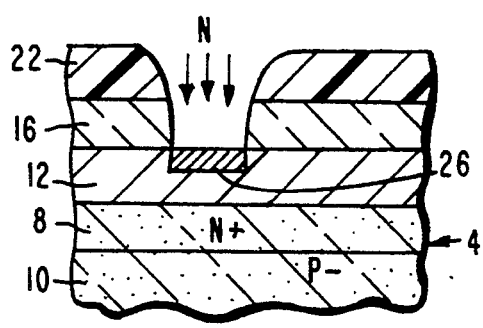

The steps involved in forming a contact through an oxide insulating layer are illustrated in FIGS. 6-8, in which elements in common with the prior figures are indicated by the same reference numerals. A low resistivity layer 12 is formed over a semiconductor substrate 4, in which a source-drain region 8 has been formed in P— well 10. A layer 12 of low resistivity material such as $TiSi_2$ has been sputtered over the substrate in a conventional manner, followed by a layer 16 of insulating material such as $SiO_2$. Finally, a layer 22 of photoresist is established over the insulating layer and patterned with an opening 24 in registration with the desired contact area.

In the next step, illustrated in FIG. 7, a plasma etch is performed to extend the contact opening through the insulating layer 16. For conventional $SiO_2$, a preferred etchant is $CHF_3$. At the end of the etch, the upper surface of silicide layer 12 is exposed in the contact opening.

Implantation into the silicide layer is performed in the next step, illustrated in FIG. 8. The same plasma etcher is preferably used to both perform the implant, and to establish the contact opening. The plasma gas is simply changed to $N_2$ at the end of the oxide etch, and the etch parameters adjusted if necessary. The oxide layer acts as a mask to define the limits of the diffusion barrier layer during the nitridation process. Thus, the implantation may be performed in a substantially continuous process with the formation of the contact opening, thereby saving a processing step.

While the plasma etch process is not deliberately heated, and in fact is preferably performed in a cooled environment, since ions hitting the wafer and the chamber walls can generate a heating effect. The temperature at the wafer should in any event not exceed a maximum of about 150° C., or the photoresist can burn. The etching is enhanced if the wafer is actively cooled, making possible a greater degree of control over the etch process. The only lower limit on the amount of cooling is imposed by cost considerations and the ability of the wafer materials to withstand the low temperature. Modern plasma systems employ water or helium gas cooling to draw heat away from the stage which supports the wafer, and thus cool the wafer itself. With water cooling the plasma etch can typically be performed at a wafer temperature on the order of 5° C. below room temperature, depending upon the water flow rate, while helium cooling allows lower temperatures to be achieved.

A diffusion barrier 26 is formed in the low resistivity material 12 immediately below the contact opening, by the process described above. This diffusion barrier is self-aligned with the contact opening, and restricted to the immediate vicinity of the opening. An $N_2$ plasma used for the plasma etch will not react with the oxide surrounding the contact opening. A portion of the low resistivity 12 is preferably left between the diffusion barrier 26 and the semiconductor, but if desired the diffusion barrier 26 can extend all the way to the semiconductor (at the cost of a relatively small increase in sensitivity).

Figure 9:
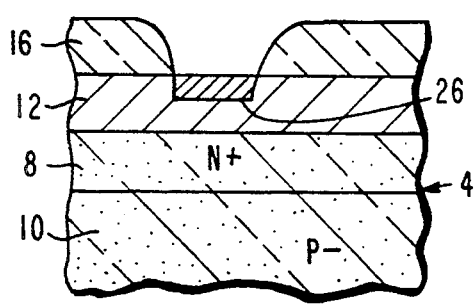
FIG. 9 is a fragmentary sectional view showing the resulting diffusion barrier.

The final step prior to metallization is the removal of photoresist layer 22, leaving a finished contact opening as shown in FIG. 9.

Figure 10:
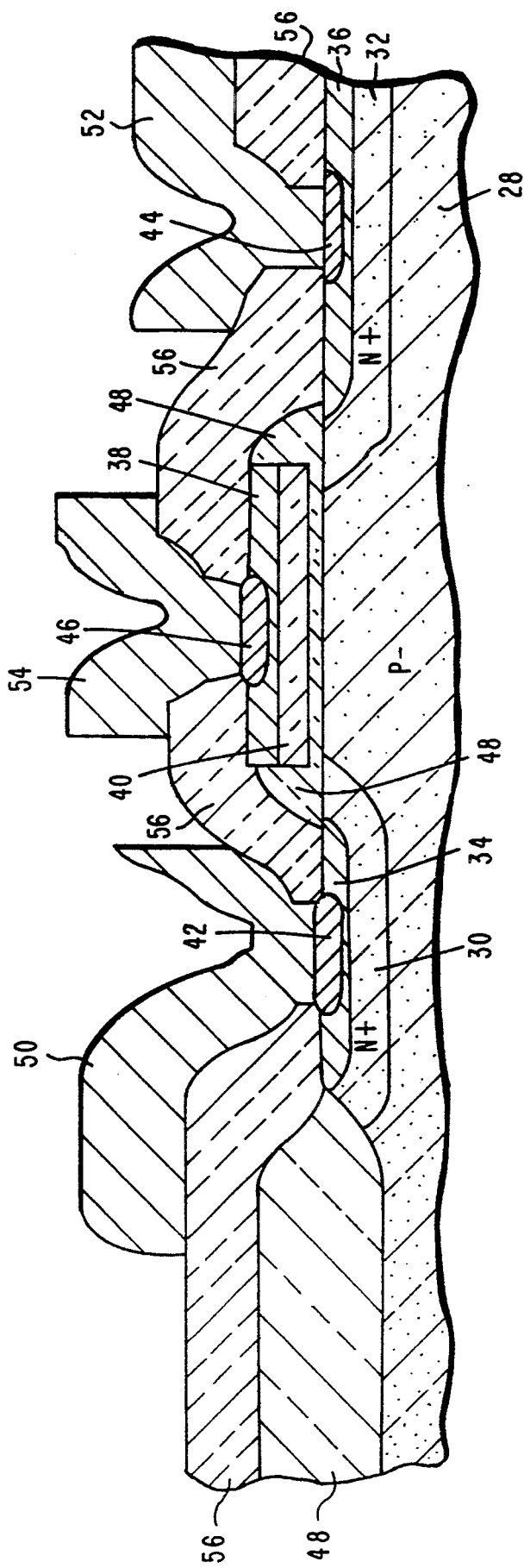
FIG. 10 is a sectional view of an FET with contact diffusion barriers according to the invention.

The invention is applicable to many different products that employ thin geometries and require a contact diffusion barrier, and may be employed with various semiconductor substrates such as Si, GaAs, In, Ph or HgCdTe. Its use in an FET is illustrated in FIG. 10. The FET is formed on a semiconductor substrate 28 and includes source and drain regions 30, 32, with a channel in between. Low resistivity layers 34 and 36 are established in the upper portions of the source and drain, respectively, while a similar low resistivity layer 38 caps a polysilicon block 40 in the gate region. Contact diffusion barriers 42, 44 and 46 have been fabricated in the low resistivity layers immediately below respective contact openings for the source, drain and gate, as described above. The device is surrounded by a field oxide 48, which also underlies the polysilicon block 40. Source, drain and gate contacts 50, 52, and 54 are made by appropriate patterned metallizations to the corresponding contact diffusion barriers, with the metallizations insulated from the polysilicon gate by a phosphorous vapor oxide layer 56. With the contact diffusion barriers fabricated as described above, the FET is effectively protected from metallization spiking, even with very thin geometries.

Figure 11:
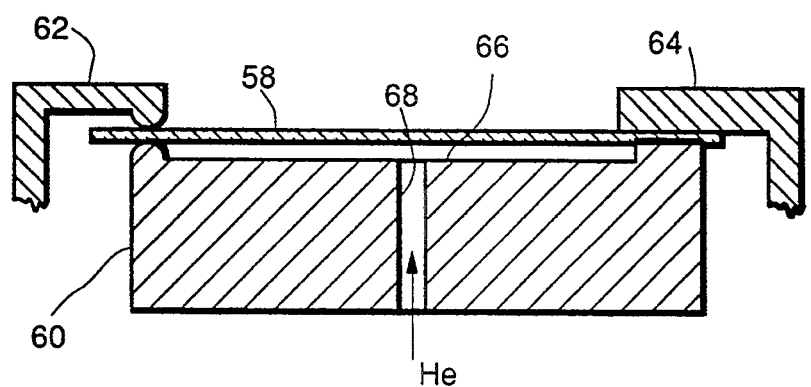
FIG. 11 is a sectional view of a plasma chamber in which the plasma etching used by the invention can be performed.

The design of plasma etch chambers is well known, and such chambers can be easily adapted for active cooling of the semiconductor wafer, if desired. Such a cooling arrangement is illustrated in FIG. 11, in which a semiconductor wafer 58 which is to be processed in accordance with the invention is retained on a stage 60 by clamps 62 and 64. A recess 66 is provided in the stage immediately below the wafer, spacing the portion of the wafer to be processed away from the stage body. Cooling helium gas is introduced into the recess on the underside of the wafer through a central opening 68 in the stage, and draws off heat transmitted through the wafer from the plasma etch processing on its upper surface.

While preferred embodiments of the invention have been shown and described, numerous variations and alternate embodiments will occur to those skilled in the art. Accordingly, it is intended that the invention be limited only in terms of the appended claims.

We claim:

1. A method of preparing a semiconductor with a contact diffusion barrier, comprising:
   forming a layer of low resistivity material over the semiconductor,
   forming an insulating layer over said low resistivity layer,
   forming a contact opening in said insulating layer in a plasma process by unheated plasma etching with a first plasma substance;
   changing said plasma substance when the etching of said contact opening has been completed to a second plasma substance that reacts with said low resistivity material to resist diffusion from a overlying metal contact material into said semiconductor;
   reacting said second plasma substance with said low resistivity material through said contact opening by a continuation of said unheated plasma process to form a conductive diffusion barrier in said low resistivity layer, said insulating layer acting as an implantation mask during said continued plasma process; and
   forming a body of electrical contact material in said opening that contacts said conductive diffusion barrier and is self-aligned with said conductive diffusion barrier and is self-aligned with said conductive diffusion barrier by said contact opening with said conductive diffusion barrier resisting diffusion from said electrical contact material into the semiconductor.

2. The method of claim 1, wherein said low resistivity material and said second plasma substance both include transition metals, and said diffusion barrier comprises a composite transition metal.

3. The method of claim 1, wherein said low resistivity material includes a transition metal, said second plasma substance is nitrogen, and said diffusion barrier comprises the nitride of said transition metal.

4. The method of claim 1, wherein said low resistivity material comprises $TiSi_2$, and said continuation of said unheated plasma process is performed with nitrogen at a direct current (DC) bias of at least 500 volts to produce said diffusion barrier of TiN.

5. The method of claim 1, wherein said step of reacting said second plasma substance with said low resistivity material is performed to a depth at which the thickness of the diffusion barrier is less than that of the original low resistivity material layer prior to said step of reacting, and a portion of the low resistivity material is interposed between said diffusion barrier and said semiconductor.

* * * * *